United States Patent [19]

Van Bavel et al.

[11] Patent Number: 4,862,169
[45] Date of Patent: Aug. 29, 1989

[54] OVERSAMPLED A/D CONVERTER USING FILTERED, CASCADED NOISE SHAPING MODULATORS

[75] Inventors: Nicholas R. Van Bavel; Tim A. Williams, both of Austin, Tex.

[73] Assignee: Motorola, Inc., Schaumburg, Ill.

[21] Appl. No.: 172,823

[22] Filed: Mar. 25, 1988

[51] Int. Cl.⁴ .......................................... H03M 3/02
[52] U.S. Cl. ...................................... 341/143; 375/33
[58] Field of Search ............. 341/143, 155, 162, 163; 381/33; 375/26, 33

[56] References Cited

U.S. PATENT DOCUMENTS

| | | | |
|---|---|---|---|
| 2,927,962 | 3/1960 | Cutler | 375/26 |
| 4,107,669 | 8/1978 | Tewksbury | 341/143 |
| 4,468,790 | 8/1984 | Höfelt | 375/33 |
| 4,704,600 | 11/1987 | Uchimura et al. | 341/144 |

Primary Examiner—William M. Shoop, Jr.
Assistant Examiner—Marc S. Hoff
Attorney, Agent, or Firm—Robert L. King

[57] ABSTRACT

An oversampling A/D converter for high resolution data conversion is provided. An analog input signal is quantized into a digital equivalent value with a finite quantization error associated therewith in a first circuit portion. An analog low pass filter is inserted between the first circuit portion and a second circuit portion similar in function and circuitry to the first circuit portion. The second circuit portion functions to remove the error of the first circuit portion from an output signal by providing a signal component, which when added with the output of the first circuit portion cancels the error of the first circuit portion. The low pass filter provides attenuation of quantization error provided by the second circuit portion which results in an output signal with a significantly attenuated error.

11 Claims, 4 Drawing Sheets

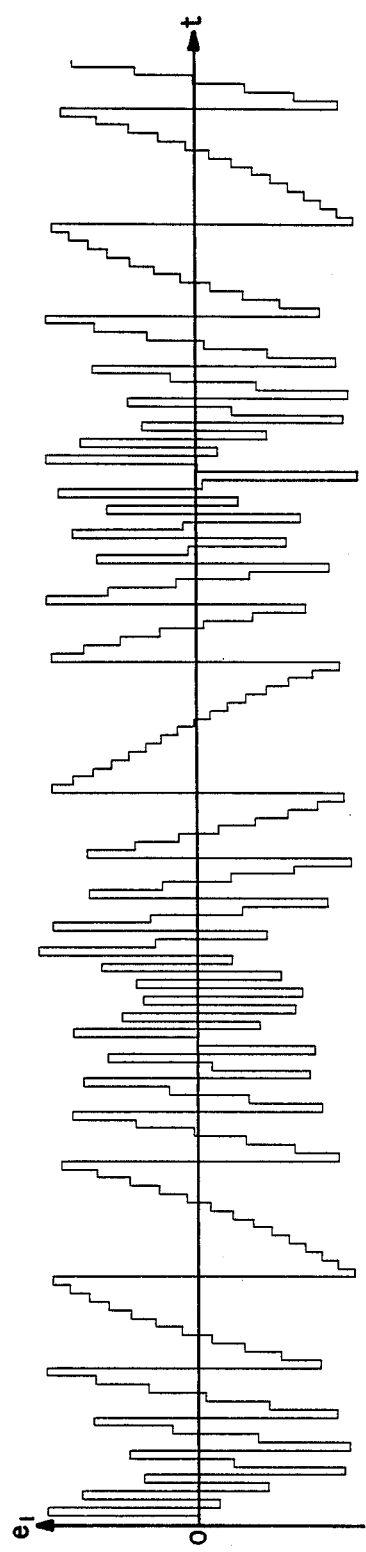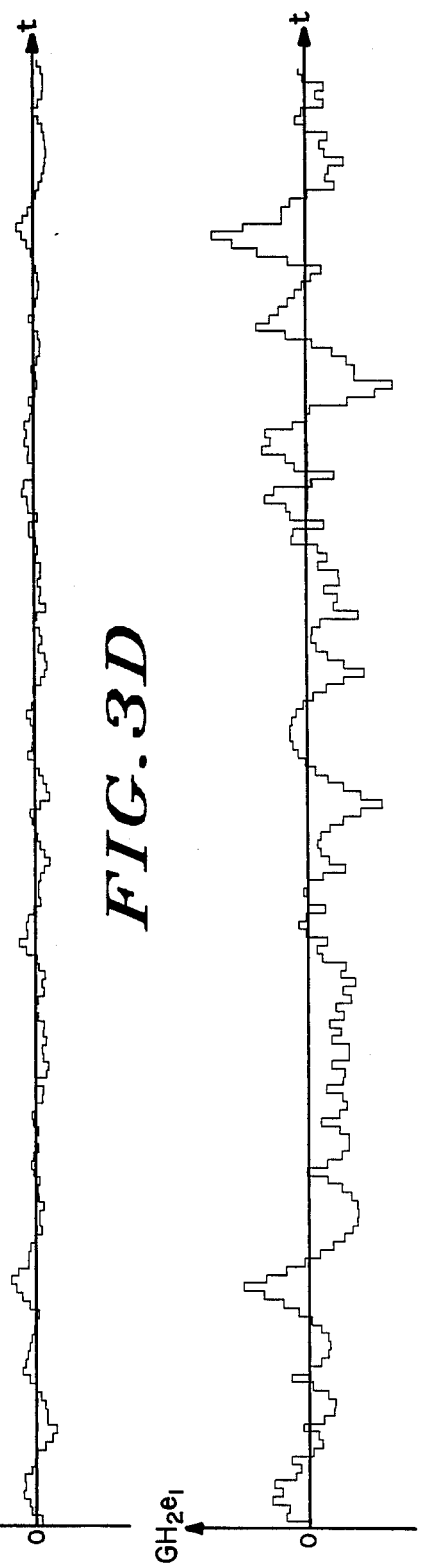
FIG.3C  FIG.3D  FIG.3E

OVERSAMPLED A/D CONVERTER USING FILTERED, CASCADED NOISE SHAPING MODULATORS

CROSS REFERENCE TO RELATED APPLICATIONS

1. Application Ser. No. 07/147,958, entitled "A MULTIPLE OUTPUT OVERSAMPLING A/D CONVERTER WITH EACH OUTPUT CONTAINING DATA AND NOISE", filed Jan. 25, 1988 by Nicholas Van Bavel and Tim A. Williams.

2. Application Ser. No. SC-00457A, entitled "AN OVERSAMPLED A/D CONVERTER HAVING DIGITAL ERROR CORRECTION", filed February 1988 by Nicholas Van Bavel and Tim A. Williams.

TECHNICAL FIELD

This invention relates generally to the field of data conversion systems, and, more particularly, to oversampling data converters for performing A/D conversion.

BACKGROUND ART

In the field of analog to digital data conversion, others have utilized sigma delta modulation for high resolution data conversion. Sigma delta modulation utilizes a multi-stage converter and performs an integration of an analog input signal with feedback to move quantization error from the passband frequency range to higher frequencies. The quantization error is in the form of noise and results from analog to digital conversion inaccuracy. A sigma delta converter having cascaded feedback loops is taught in U.S. Pat. No. 4,704,600 entitled "An Oversampling Converter" by Uchimura et al.. Ideally, the more quantization loops which exist in a sigma delta converter, the smaller the quantization error becomes. However, when minimization of errors is emphasized, problems in addition to the increase of circuit size are created. Gains associated with the analog circuit portions of the quantization loops can vary and provide mismatching gain errors which are as significant, if not more so, than the quantization error which the additional loops are compensating for. Additionally, decimation filters which are typically used in conjunction with the output signal of sigma delta converters increase proportionately in size as the number of quantization loops increases.

BRIEF DESCRIPTION OF THE INVENTION

Accordingly, an object of the present invention is to provide an improved oversampled A/D converter using filtered, cascaded noise shaping modulators.

Another object of the present invention is to provide an improved method for analog to digital data conversion.

Yet another object of this invention is to provide an improved method for improving signal to noise ratio performance in an oversampled data converter.

Yet a further object of the present invention is to provide an improved method for obtaining higher signal to noise ratio performance in an oversampling A/D converter. In carrying out the above and other objects of the present invention, there is provided, in one form, an oversampling A/D converter operating at a sampling frequency higher than an input signal frequency and having an input for receiving an analog input signal and an output for providing an equivalent digital output signal. The converter has a plurality of quantization loops including at least first and second quantization loops. Each quantization loop comprises an integrator, a quantizer and a feedback portion. The integrator integrates a difference between an input terminal signal and a feedback signal. The quantizer quantizes an output from the integrator and provides a loop output signal. The feedback portion has an input coupled to the loop output signal and an output for providing the feedback signal. A first filter is provided having an input coupled to a first loop output signal and filters the first loop output signal by a first transfer function to provide a first filter signal. A second filter is provided having an input coupled to the output of the integrator of the first loop, and an output. The second filter filters the output of the integrator of the first loop by a second transfer function to provide the input terminal signal for the second quantization loop. A gain circuit is provided having an input coupled to the output of the second filter and amplifies the input terminal signal for the second quantization loop. An output portion has an input coupled to the loop output signal of the second quantization loop for attenuating the loop output signal of the second quantization loop. An adder is coupled to the first and second quantization loops, for summing the filtered first loop output signal and the second loop output signal to provide the digital output signal.

These and other objects, features and advantages will be more clearly understood from the following detailed description taken in conjunction with the accompanying drawings.

BRIEF DESCRIPTION OF THE DRAWINGS

FIGS. 3A-3E illustrate in graphical form waveforms associated with the converter of FIG. 2.

DETAILED DESCRIPTION OF THE INVENTION

Figure 1:
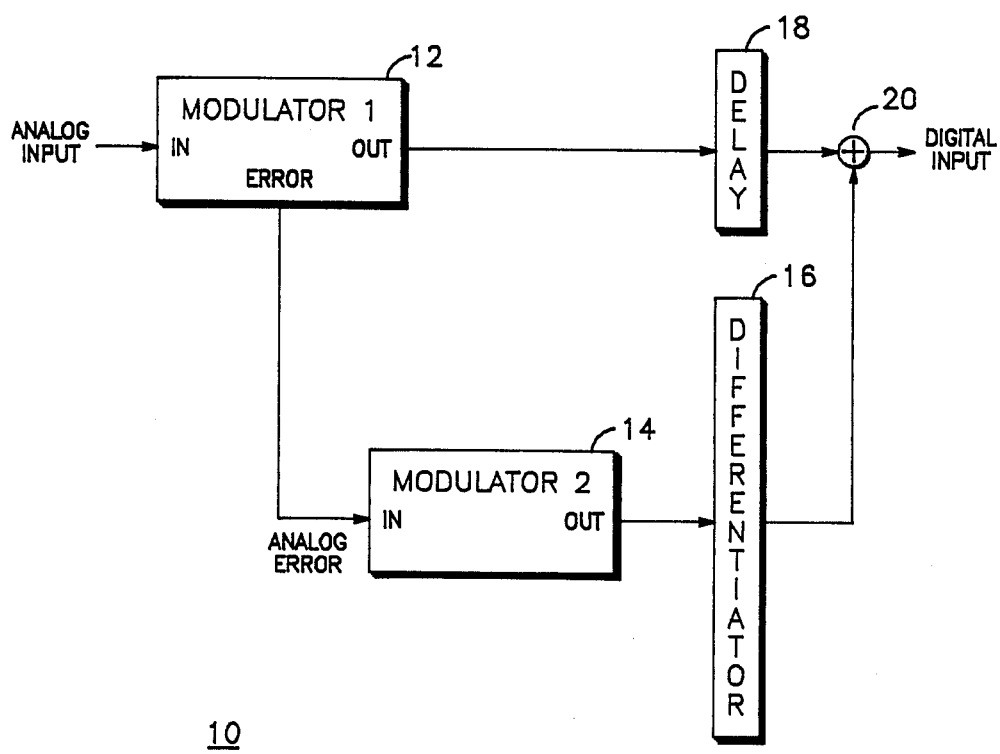
FIG. 1 illustrates in block diagram form a conventional sigma delta converter.

Shown in FIG. 1 is a known sigma delta converter 10 for converting an analog input signal to a digital output signal. A first modulator circuit 12 has an input for receiving the analog input signal and an output for providing a converted digital signal value. Inherent in the conversion process is a finite quantization error which is included in the output signal of modulator circuit 12. By use of internal feedback (not shown), the quantization error may be segregated from the output signal and outputted in analog form at an error output terminal. A second modulator circuit 14 has a data input coupled to the error output terminal of modulator circuit 12. An output of second modulator circuit 14 is connected to an input of a digital differentiator circuit 16. An output of modulator circuit 12 is connected to an input of a delay circuit 18. An output of delay circuit 18 is connected to a first input of an adder circuit 20. An output of differentiator circuit 16 is connected to a second input of adder circuit 20. An output of adder circuit 20 provides a digital output signal. In operation, the analog error signal outputted by modulator 12 is provided by internally converting the digital output of modulator 12 to an analog value and subtracting an integrated form of the analog input. After the analog error signal is connected to modulator 14, the error signal is digitized by modulator 14 and digitally recombined with the output of modulator 12 via differentiator 16 and adder 20. The resultant combination cancels the quantization noise generated by modulator 12. The only remaining error in the output signal is quantization noise introduced by modulator 14. However, the quantization noise of modulator 14 is shaped by differentiator 16 which functions to substantially attenuate the noise in the passband frequency range at the expense of amplifying the higher frequency band noise. Since the output signal may be filtered to remove the quantization noise in frequencies which are outside the passband frequency, an accurate converted output is provided. If additional quantization loops are provided, further noise may be removed from the passband frequency. However, other errors introduced by the analog circuitry may become more significant so that additional quantization loops are not sufficiently advantageous.

Figure 2:
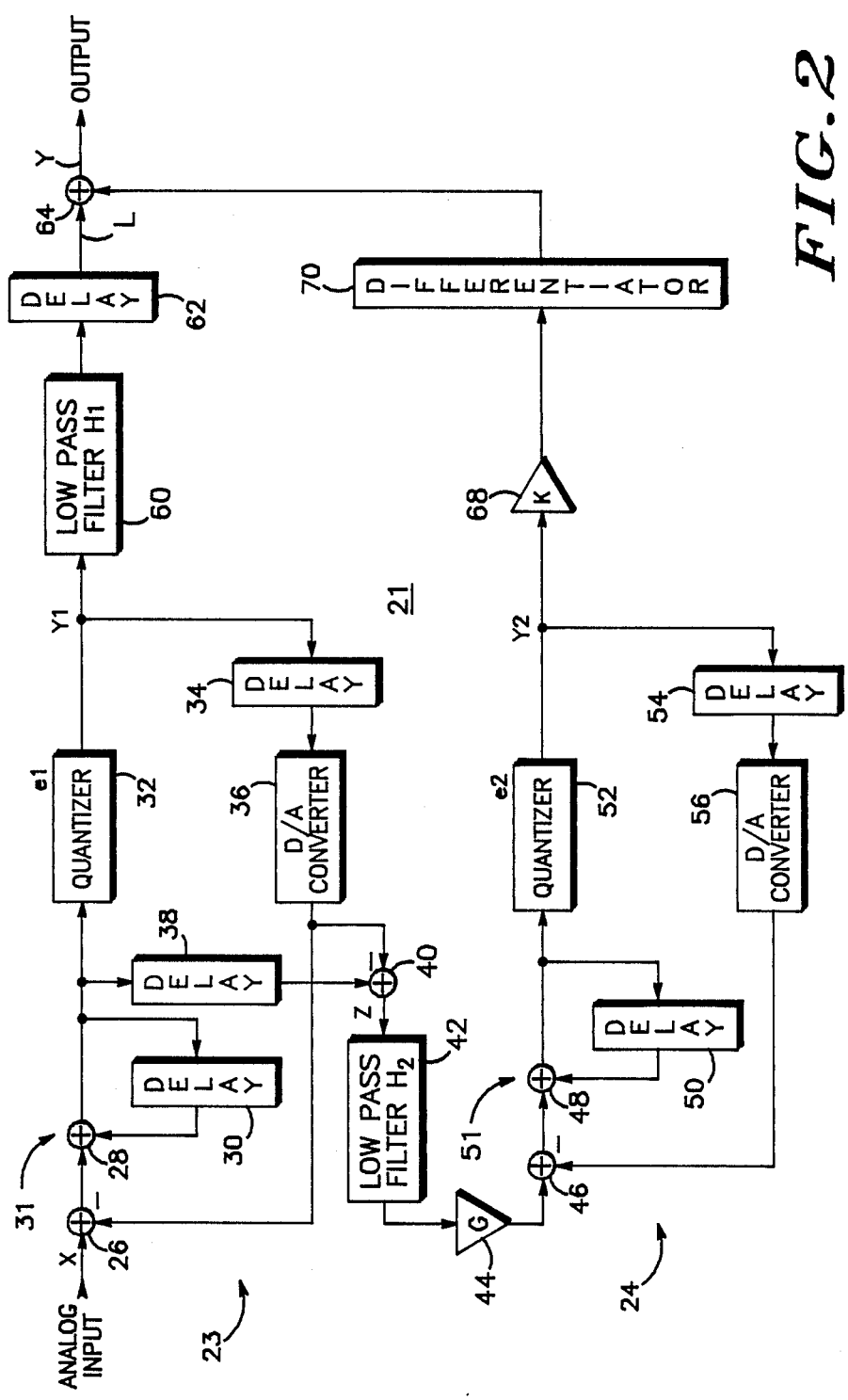
FIG. 2 illustrates in block diagram form an oversampled converter in accordance with the present invention.

Shown in FIG. 2 is an oversampled A/D converter 21 in accordance with the present invention. Generally, converter 21 comprises a first quantization loop 23 and a second quantization loop 24. Although two quantization loops are illustrated, it should be understood that the present invention may be extended to include additional quantization loops if desired. Quantization loop 23 has an input terminal for receiving an analog input signal labeled "X" coupled to a first input of a subtractor circuit 26. An output of subtractor circuit 26 is connected to a first input of an adder circuit 28. An output of adder circuit 28 is connected to an input of a delay circuit 30. An output of delay circuit 30 is connected to a second input of adder circuit 28. Adder circuit 28 and delay circuit 30 comprise an integrator 31. The output of adder circuit 28 is also connected to an input of a quantizer circuit 32 having a quantization error labeled "e1" associated therewith. An output of quantizer circuit 32 provides a signal labeled "Y1" and is connected to an input of a delay circuit 34. An output of delay circuit 34 is connected to an input of a D/A converter 36. An output of D/A converter 36 is connected to a second input of subtractor circuit 26. An output of adder circuit 28 is also connected to an input of a delay circuit 38. An output of delay circuit 38 is connected to a first input of a subtractor circuit 40. An output of D/A converter 36 is also connected to a second input of subtractor circuit 40. An output of subtractor circuit 40 provides a signal labeled "Z" and is connected to an input of an analog low pass filter circuit 42 having a transfer function labeled "H2". An output of filter circuit 42 is connected to an input of an amplifier circuit 44 having a gain labeled "G". Quantization loop 24 comprises a subtractor circuit 46 having a first input connected to an output of gain circuit 44. An output of subtractor circuit 46 is connected to a first input of an adder circuit 48. An output of adder circuit 48 is connected to a delay circuit 50. An output of delay circuit 50 is connected to a second input of adder circuit 48. Adder circuit 48 and delay circuit 50 comprise an integrator 51. An output of adder circuit 48 is connected to an input of a quantizer circuit 52 having a quantization error labeled "e2" associated therewith. An output of quantizer circuit provides a signal labeled "Y2" and is connected to an input of a delay circuit 54. An output of delay circuit 54 is connected to an input of a D/A converter 56. An output of D/A converter 56 is connected to a second input of adder circuit 46. An output of quantizer circuit 32 is connected to an input of a digital low pass filter circuit 60 having a transfer function labeled "H1". An output of filter circuit 60 is connected to an input of a delay circuit 62. An output of delay circuit 62 provides a signal labeled "L" and is connected to a first input of an adder circuit 64. Adder circuit 64 provides a digital output signal labeled "Y" at an output thereof. An output of quantizer circuit 52 is connected to an input of a gain circuit 68 having a gain labeled "K". An output of gain circuit 68 is connected to an input of a differentiator circuit 70. An output of differentiator circuit 70 is connected to a second input of adder circuit 64.

Figure 3A:
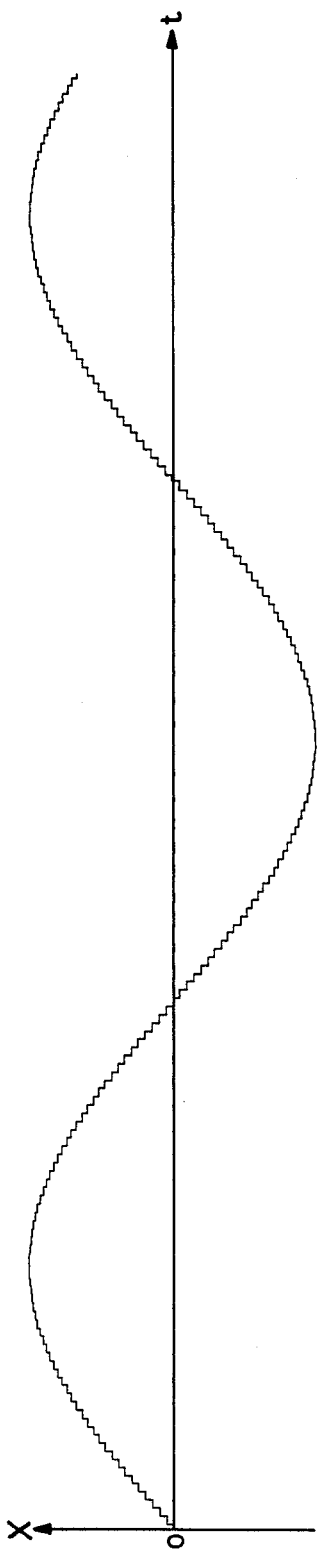

In operation, converter 21 receives an analog input signal X which may be represented graphically in FIG. 3A as a sinusoidal input signal. A mathematical analysis of converter 21 in the frequency domain will illustrate the principle of operation of the present invention. Quantization loops 23 and 24 each function as a noise shaping modulator. In quantization loop 23, the signal (X-Y1D) is integrated by integrator 31 where "Y1D" represents a delayed Y1 signal and "D" is the frequency domain equivalent of a delay element. The integrated signal is then quantized or converted into a digital form with some finite error, e1, associated with the quantization. From a frequency standpoint, the signal Y1 of quantization loop 23 may be represented as:

$$Y1=[X-Y1D]/[1-D]+e1 \qquad (1)$$

where [1/(1-D)] represents the integration of the signal (X-Y1D) performed by integrator 31. Equation one may be rewritten as:

$$Y1=X+e1(1-D). \qquad (2)$$

Figure 3B:
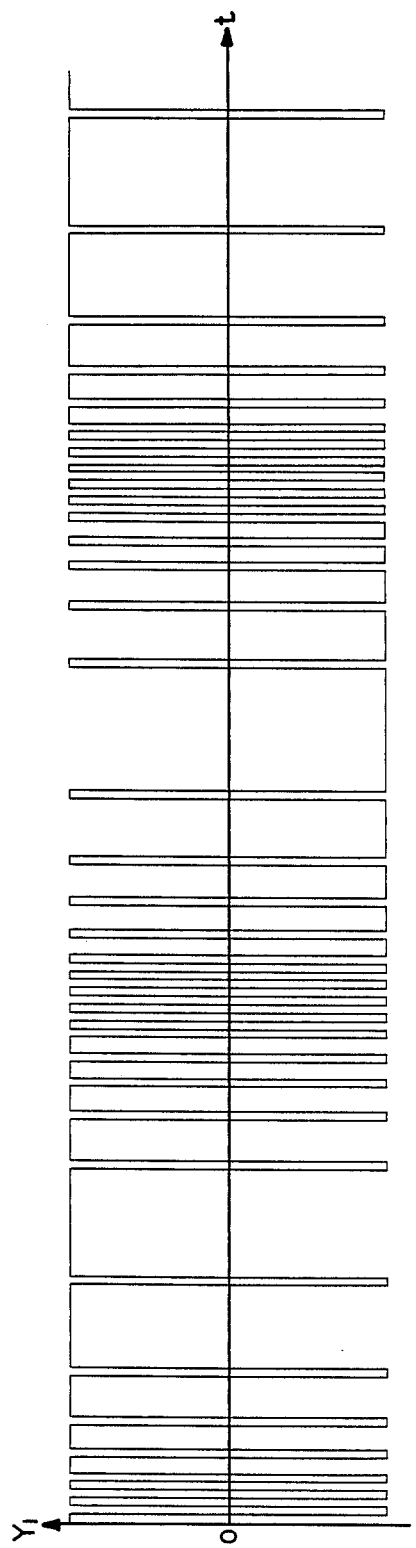

Signal Y1 is represented graphically in FIG. 3B and comprises data component X and shaped noise e1(1-D). Signal Z which is provided by subtractor circuit 40 may be represented by:

$$Z=(Y1-e1)D-Y1D. \qquad (3)$$

The component (Y1-e1) is the signal which is at the output of adder circuit 28 which is then delayed before being coupled to subtractor circuit 40. Upon closer examination of equation three, it can be readily seen that signal Z may be expressed as:

$$Z=-e1D. \qquad (4)$$

The signal (e1D) is a delayed error signal e1 illustrated in FIG. 3C. The low pass filter 42 and amplifier circuit 44 modify signal Z so that the input signal which is connected to the first input of subtractor circuit 46 is (-GH2e1D). The signal H2e1 is illustrated graphically in FIG. 3D, and the signal GH2e1 is illustrated in FIG. 3E. Quantization loop 24 functions to integrate the output of subtractor circuit 46 and quantize the analog output value provided by integrator 51 to provide a digital output signal Y2. The output signal Y2 may be represented in the frequency domain as:

$$Y2=[(-GH2e1D)-Y2D]/(1-D)+e2 \qquad (5)$$

which is equivalent to:

$$Y2=-e1DH2G+e2(1-D). \qquad (6)$$

Signal Y2 is then attenuated by a gain factor of K and differentiated before being coupled to the second input of adder circuit 64. The output of delay circuit 62 is a delayed, filtered version of signal Y1. Therefore, the output of delay circuit may be represented by the expression (Y1H1D) which is equivalent to:

$$L = X1H1D + e1H1(1-D)D. \quad (7)$$

The output signal Y may be represented as:

$$Y = L + Y2K(1-D). \quad (8)$$

Substituting the previously developed expressions for L and Y2 into equation eight results in the following expression:

$$Y = X1H1D + e1H1(1-D)D - e1DH2GK(1-D) + e2(1-D)K(1-D). \quad (9)$$

If the gain G is made equal to the reciprocal of gain K, and the transfer functions H1 and H2 of filters 60 and 42, respectively, are made equal, the second and third expressions on the right hand side of equation nine are seen to cancel. Therefore, signal Y becomes:

$$Y = X1H1D + e2(1-D)2K. \quad (10)$$

The digital output signal Y contains two components, a signal component and an error component. However, the error component is a significantly attenuated error component in that the gain K may be made a fractional value to substantially minimize the error term e2. The accurate output signal has been achieved with only two quantization loops and represents a significant improvement over known sigma delta converters having two quantization loops. Low pass filters 60 and 42 are conventional low pass filter circuits, and the transfer functions may be implemented to be substantially equal. Low pass filter 42 reduces the amplitude of signal Z so that the gain G of gain circuit 44 does not saturate the second quantization loop 24. After the band limited signal Z is digitized, the digital gain K attenuates the output by a factor of (1/G) thereby reducing quantization noise error generated by quantization loop 24. For ideal low pass filters, the value of (1/K) is proportional to the square root of the oversampling rate of converter.

By now it should be appreciated that an oversampled A/D converter using filtered, cascaded noise shaping modulators has been provided. A noisy error signal e1 which results from the first quantization loop digitizing the input signal X is filtered with a transfer function which substantially removes the noise and provides a low amplitude analog signal as the input terminal signal for the second quantization loop 24. By amplifying the input terminal signal which is coupled to the second quantization loop by a gain G, the signal to noise ratio at the output of quantization loop 24 is improved. A signal to noise ratio using less circuitry is achieved by the present invention in sigma delta data converters. As a result of the significant attenuation achieved in only two quantization loops, the effect of gain errors associated with analog circuitry is significantly minimized.

While the invention has been described in the contex of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:
1. An oversampling A/D converter operating at a sampling frequency higher than an input signal frequency and having an input for receiving an analog input signal and an output for providing an equivalent digital output signal, comprising: first and second quantization loops, each quantization loop comprising:
   means for integrating a difference between an input terminal signal and a feedback signal;
   a quantizer for quantizing an output from the integrator and providing a loop output signal; and
   feedback means having an input coupled to the loop output signal and an output for providing the feedback signal;
   first filter means having an input coupled to a first loop output signal of a first quantization loop, for filtering the first loop output signal by a first transfer function to provide a first filter signal;
   second filter means having an input coupled to the output of the integrator of the first loop, and an output, said second filter means filtering the output of the integrator of the first loop by a second transfer function to provide the input terminal signal for the second quantization loop;
   gain means having an input coupled to the output of the second filter means, for amplifying the input terminal signal for the second quantization loop; and
   output means having an input coupled to the loop output signal of the second quantization loop for attenuating the loop output signal of the second quantization loop.
2. The oversampling converter of claim 1 further comprising:
   summing means coupled to the first and second quantization loops, for summing the filtered first loop output signal and the second loop output signal to provide the digital output signal.
3. The converter of claim 1 wherein the first and second transfer functions are substantially equal.
4. The converter of claim 1 wherein the means for integrating in each of said first and second quantization loops comprises:
   an adder having a first input for receiving the difference between the input terminal signal and the feedback signal, a second input, and an output for providing an integrated output; and
   a delay circuit having an input coupled to the output of the adder, and an output coupled to the second input of the adder, for providing the integrated output as a delayed input for summing with the difference between the input terminal signal and the feedback signal by the adder.
5. The converter of claim 1 wherein the first filter means is a digital low pass filter.
6. The converter of claim 1 wherein the second filter means is an analog low pass filter.
7. In an oversampling A/D converter operating at a sampling frequency higher than an input signal frequency and having an input for receiving an analog input signal and an output for providing an equivalent digital output signal, a method for converting the analog input signal to the digital output signal, comprising the steps of:
   providing first and second quantization loops, each quantization loop comprising:
   means for integrating a difference between an input terminal signal and a feedback signal;

a quantizer for quantizing an output from the integrator and providing a loop output signal; and feedback means having an input coupled to the loop output signal and an output for providing the feedback signal;

filtering the first loop output signal by a first transfer function to provide a first filter signal;

filtering the output of the integrator of the first loop by a second transfer function to provide the input terminal signal for the second quantization loop;

amplifying the input terminal signal for the second quantization loop; and attenuating the loop output signal of the second quantization loop.

8. The method of converting of claim 7 further comprising the step of:

summing the filtered first loop output signal and the second loop output signal to provide the digital output signal.

9. An oversampling A/D converter having an input for receiving analog input signal and an output for providing an equivalent digital output signal, comprising:

a first subtractor having a first input for receiving the analog input signal, a second input for receiving a first feedback signal, and an output for providing a difference between the input signal and the first feedback signal;

a first integrator having an input coupled to the output of the first adder and an output, said first integrator integrating the output of the first subtractor;

a first quantization circuit having an input coupled to the output of the first integrator, and an output for converting the input to a first digital signal;

a first delay circuit having an input coupled to the output of the quantization circuit, and an output for providing a delayed first digital signal;

a first D/A converter circuit having an input coupled to the output of the first delay circuit, and having an output coupled to the second input of the first adder for providing the first feedback signal;

a second delay circuit having an input coupled to the output of the integrator, and an output;

a second subtractor having a first input coupled to the output of the second delay circuit, a second input coupled to the output of the first D/A converter, and an output;

a first filter having an input coupled to the output of the second subtractor, and an output, said first filter filtering the output of the second subtractor;

a gain circuit having an input coupled to the output of the first filter, and having an output for amplifying the output of the first filter;

a third subtractor having a first input coupled to the output of the gain circuit, a second input for receiving a second feedback signal, and an output for providing a difference of the output of the gain circuit and the second feedback signal;

a second integrator having an input coupled to the output of the third subtractor and an output, said second integrator integrating the output of the third subtractor;

a second quantization circuit having an input coupled to the output of the second integrator, and an output for converting the output of the second integrator to a second digital signal;

a third delay circuit having an input coupled to the output of the second quantizer circuit, and having an output for providing a delayed second digital signal;

a second D/A converter having an input coupled to the output of the third delay circuit, and an output for providing the second feedback signal;

an attenuation circuit having an input coupled to the output of the second quantization circuit, and having an output for attenuating the second digital signal;

a differentiator circuit having an input coupled to the output of the attenuation circuit and an output, for differentiating the second digital signal;

a second filter having an input coupled to the output of the first quantization circuit and an output for filtering the output of the first quantization circuit; and a fourth delay circuit having an input coupled to the output of the second filter, and an output for providing a delayed output of the second filter.

10. The oversampling A/D converter of claim 9 further comprising:

an adder having a first input coupled to the output of the fourth delay circuit, a second input coupled to the output of the differentiator circuit, and an output for providing the digital output signal.

11. The oversampling A/D converter of claim 9 wherein the first and second integrators each comprise:

an adder having a first input terminal functioning as the input of each integrator, a second input, and an output for providing the output of the integrator; and a delay circuit having an input coupled to the output of the adder, and an output coupled to the second input of the adder.

* * * * *